(12) United States Patent
Reynaud et al.

(10) Patent No.: US 9,293,473 B2
(45) Date of Patent: Mar. 22, 2016

(54) METHOD FOR MANUFACTURING A SEMICONDUCTOR ON INSULATOR STRUCTURE HAVING LOW ELECTRICAL LOSSES

(71) Applicant: Soitec, Crolles Cedex (FR)

(72) Inventors: Patrick Reynaud, Murianette (FR); Sebastien Kerdiles, Saint Ismier (FR); Daniel Delprat, Crolles (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/612,772

(22) Filed: Feb. 3, 2015

(65) Prior Publication Data

US 2015/0171110 A1 Jun. 18, 2015

Related U.S. Application Data

(60) Division of application No. 14/049,263, filed on Oct. 9, 2013, now Pat. No. 8,962,450, which is a continuation of application No. 13/487,066, filed on Jun. 1, 2012, now Pat. No. 8,658,514, which is a continuation of application No. PCT/EP2010/068883, filed on Dec. 3, 2010.

(30) Foreign Application Priority Data

Dec. 4, 2009 (FR) ..................... 09 58658

(51) Int. Cl.
*H01L 27/12* (2006.01)
*H01L 21/762* (2006.01)
*H01L 29/06* (2006.01)

(52) U.S. Cl.
CPC ...... *H01L 27/1203* (2013.01); *H01L 21/76254* (2013.01); *H01L 29/0649* (2013.01)

(58) Field of Classification Search
CPC ............ H01L 27/1203; H01L 21/7624; H01L 21/76243; H01L 21/76245; H01L 21/76248; H01L 21/7651; H01L 21/7654; H01L 21/7656; H01L 21/7659; H01L 21/7662; H01L 21/7664; H01L 21/7667; H01L 21/763
See application file for complete search history.

(56) References Cited

U.S. PATENT DOCUMENTS 3,500,138 A * 3/1970 Richman Paul ......... H01L 29/00
257/378
3,577,019 A * 5/1971 Storm .................... H03G 1/007
257/365

(Continued)

FOREIGN PATENT DOCUMENTS

EP 168990 A2 5/1989
JP 2004006615 A 1/2004

(Continued)

OTHER PUBLICATIONS

International Search Report for International Application No. PCT/EP2010/068883 dated Mar. 1, 2011, 3 pages.

(Continued)

*Primary Examiner* — Michele Fan
(74) *Attorney, Agent, or Firm* — TraskBritt

(57) ABSTRACT

A manufacturing process for a semiconductor-on-insulator structure having reduced electrical losses and which includes a support substrate made of silicon, an oxide layer and a thin layer of semiconductor material, and a polycrystalline silicon layer interleaved between the support substrate and the oxide layer. The process includes a treatment capable of conferring high resistivity to the support substrate prior to formation of the polycrystalline silicon layer, and then conducting at least one long thermal stabilization on the structure at a temperature not exceeding 950° C. for at least 10 minutes.

19 Claims, 3 Drawing Sheets

(56) References Cited

U.S. PATENT DOCUMENTS

| | | | |
|---|---|---|---|
| 4,737,838 A * | 4/1988 | Watanabe | H01L 28/40 257/306 |
| 5,374,564 A | 12/1994 | Bruel | |
| 5,492,859 A | 2/1996 | Sakaguchi et al. | |
| 5,561,303 A | 10/1996 | Schrantz et al. | |
| 5,694,065 A * | 12/1997 | Hamasaki | H03K 19/00361 326/83 |
| 5,985,708 A * | 11/1999 | Nakagawa | H01L 27/1203 257/E27.112 |
| 6,127,199 A * | 10/2000 | Inoue | G02F 1/13454 257/E21.567 |
| 6,171,932 B1 | 1/2001 | Shiota | |
| 6,426,270 B1 * | 7/2002 | Sakaguchi | H01L 21/76259 257/E21.57 |
| 6,472,711 B1 | 10/2002 | Shiota | |
| 6,855,588 B1 * | 2/2005 | Liao | H01L 29/42384 257/E29.137 |
| 7,147,711 B2 | 12/2006 | Tamatsuka et al. | |
| 7,902,045 B2 | 3/2011 | Arena et al. | |
| 7,964,423 B2 | 6/2011 | Akimoto | |
| 8,507,922 B2 * | 8/2013 | Kawamoto | C30B 29/36 257/77 |
| 2002/0142557 A1 * | 10/2002 | Hashimoto | H01L 21/8249 438/309 |
| 2002/0146867 A1 * | 10/2002 | Salvatore | H01L 21/76202 438/149 |
| 2003/0040163 A1 | 2/2003 | Yokokawa | |
| 2003/0170990 A1 | 9/2003 | Sakaguchi et al. | |
| 2003/0183819 A1 * | 10/2003 | Aoki | H01L 21/02381 257/55 |
| 2004/0002197 A1 | 1/2004 | Fathimulla et al. | |
| 2004/0159908 A1 | 8/2004 | Fathimulla et al. | |
| 2004/0235264 A1 * | 11/2004 | Forbes | H01L 21/26506 438/429 |
| 2004/0259388 A1 | 12/2004 | Schwarzenbach | |
| 2005/0054175 A1 * | 3/2005 | Bauer | H01L 21/02381 438/404 |
| 2005/0127477 A1 | 6/2005 | Takase et al. | |
| 2005/0158969 A1 | 7/2005 | Binns et al. | |
| 2005/0250349 A1 | 11/2005 | Sadamitsu et al. | |
| 2005/0253221 A1 | 11/2005 | Takase et al. | |
| 2005/0269671 A1 | 12/2005 | Faure et al. | |
| 2005/0280001 A1 * | 12/2005 | Chang | H01L 21/84 257/68 |
| 2006/0024908 A1 | 2/2006 | Neyret et al. | |
| 2006/0134893 A1 * | 6/2006 | Savage | H01L 21/6835 438/483 |
| 2006/0141748 A1 | 6/2006 | Daval et al. | |
| 2006/0166451 A1 | 7/2006 | Raskin et al. | |
| 2006/0214257 A1 * | 9/2006 | Ninomiya | H01L 21/26506 257/502 |
| 2006/0284247 A1 * | 12/2006 | Augustine | H01L 21/8258 257/338 |
| 2007/0032040 A1 | 2/2007 | Lederer | |
| 2007/0032042 A1 | 2/2007 | Takayama et al. | |
| 2007/0066033 A1 | 3/2007 | Kurita et al. | |
| 2007/0080372 A1 | 4/2007 | Faure | |
| 2008/0014717 A1 | 1/2008 | Endo et al. | |
| 2008/0050887 A1 | 2/2008 | Chen et al. | |
| 2008/0303118 A1 | 12/2008 | Arena et al. | |
| 2009/0042361 A1 | 2/2009 | Takeno | |
| 2009/0075456 A1 | 3/2009 | Akimoto et al. | |
| 2009/0092810 A1 * | 4/2009 | Lee | H01L 21/3226 428/220 |
| 2009/0170295 A1 * | 7/2009 | Vincent | H01L 21/7624 438/507 |
| 2009/0173967 A1 * | 7/2009 | Hamaguchi | H01L 21/76251 257/190 |
| 2010/0019872 A1 * | 1/2010 | Bozler | B81B 7/0064 333/248 |
| 2010/0297828 A1 | 11/2010 | Maleville | |
| 2010/0314722 A1 | 12/2010 | Ishizuka et al. | |
| 2012/0319121 A1 | 12/2012 | Reynaud et al. | |
| 2014/0038388 A1 | 2/2014 | Reynaud et al. | |

FOREIGN PATENT DOCUMENTS

| | | |
|---|---|---|
| JP | 2005123351 A | 5/2005 |
| JP | 2007507093 A | 3/2007 |
| WO | 2005029576 A2 | 3/2005 |
| WO | 2009122306 A2 | 10/2009 |
| WO | 2010049496 A1 | 5/2010 |

OTHER PUBLICATIONS

International Written Opinion for International Application No. PCT/EP2010/068883 dated Mar. 1, 2011, 7 pages.

International Preliminary Report on Patentability for International Application No. PCT/EP2010/068883 dated Jul. 4, 2012, 8 pages.

* cited by examiner

METHOD FOR MANUFACTURING A SEMICONDUCTOR ON INSULATOR STRUCTURE HAVING LOW ELECTRICAL LOSSES

CROSS-REFERENCE TO RELATED APPLICATIONS

This application is a divisional of U.S. patent application Ser. No. 14/049,263, filed Oct. 9, 2013, now U.S. Pat. No. 8,962,450, issued Feb. 24, 2015, which is a continuation of U.S. application Ser. No. 13/487,066 filed Jun. 1, 2012, now U.S. Pat. No. 8,658,514, issued Feb. 25, 2014, which is a continuation of International Application No. PCT/EP2010/068883 filed Dec. 3, 2010, which claims priority of French Application No. 0958658 filed Dec. 4, 2009, the entire content of each of which is expressly incorporated herein by reference thereto.

BACKGROUND

The present invention relates to a manufacturing process for a structure of a semiconductor on insulator (SeOI) having reduced electrical losses. It also relates to such a structure.

The invention focuses on the general context of manufacturing a structure of semiconductor on insulator type (SOI) by the SMART CUT® process. This process is described in detail, for example, in U.S. Pat. No. 5,374,564. A structure of this type generally comprises a support layer, typically made of silicon monocrystalline having high resistivity, an insulating oxide layer, and a thin layer of semiconductor material. The thin layer is designed to take up components, typically electronic components.

In particular, in applications in which use is made of radio-frequencies, for example, in the field of radiophony, part of the emitted waves can be absorbed by the support substrate, despite the presence of the insulating layer, resulting in electrical losses. To combat this difficulty, it has been proposed to boost resistivity of the support substrate to over 500 Ω·cm, or even over a few thousand Ohms·cm, though this does not prove to be sufficient. It was then proposed to deposit on the upper face of the support substrate (that is, the one receiving the insulating layer and the thin layer), a layer of material whereof the density of charge-carrier traps is high. A polycrystalline silicon layer is adapted in particular to ensure this function. Its structure is formed by a multitude of crystalline grains having defective boundaries (grain joint) forming traps, which makes the ensemble particularly low-conductive. This reduces leakage currents and losses in resistivity at the level of the support substrate.

The technique to achieve the foregoing structure includes depositing a polycrystalline silicon layer on the support substrate, then applying the usual steps of the SMART CUT® process. This type of method is described in particular in U.S. Patent Publication 2007/0032042. When conducting tests on resulting structures which would exhibit high resistivity according to the teachings of that application, however, it was found that the technique in question did not reduce electrical losses satisfactorily. Thus, there remains a need for different solutions to this problem, and these are now provided by the present invention.

SUMMARY OF THE INVENTION

The present invention now provides a manufacturing process for a semiconductor on insulator type structure having reduced electrical losses, in which the polycrystalline silicon layer which is placed on the support substrate has the expected resistive character.

The process is applied to a substrate successively comprising a support substrate made of silicon, an oxide layer and a thin layer of semiconductor material, and having a polycrystalline silicon layer interleaved between the support substrate and the oxide layer. The process includes oxidizing a donor substrate made of semiconductor material to form an oxide layer on a surface thereof; implanting ions in the donor substrate to form an embrittlement zone therein; bonding the donor and support substrates together with the oxide layer being located therebetween at a bonding interface, the substrate support having a high resistivity that is greater than 500 Ω·cm, and a polycrystalline silicon layer on its upper face which is bonded the donor substrate; fracturing the donor substrate at the embrittlement zone to transfer to the support substrate a thin layer of semiconductor material from the donor substrate and form a an SeOI structure; and conducting at least one thermal stabilization of the SeOI structure, at a temperature not exceeding 950° C., and for a time of at least 10 minutes.

The invention also relates to the structures that are provided by the method. These structures have an average resistivity that is greater than 10,000 Ohms·cm.

BRIEF DESCRIPTION OF THE DRAWING FIGURES

Other characteristics and advantages of the present invention will emerge from the following description of certain preferred embodiments. This description will be given in reference to the attached diagrams, in which.

DETAILED DESCRIPTION

Figure 1:
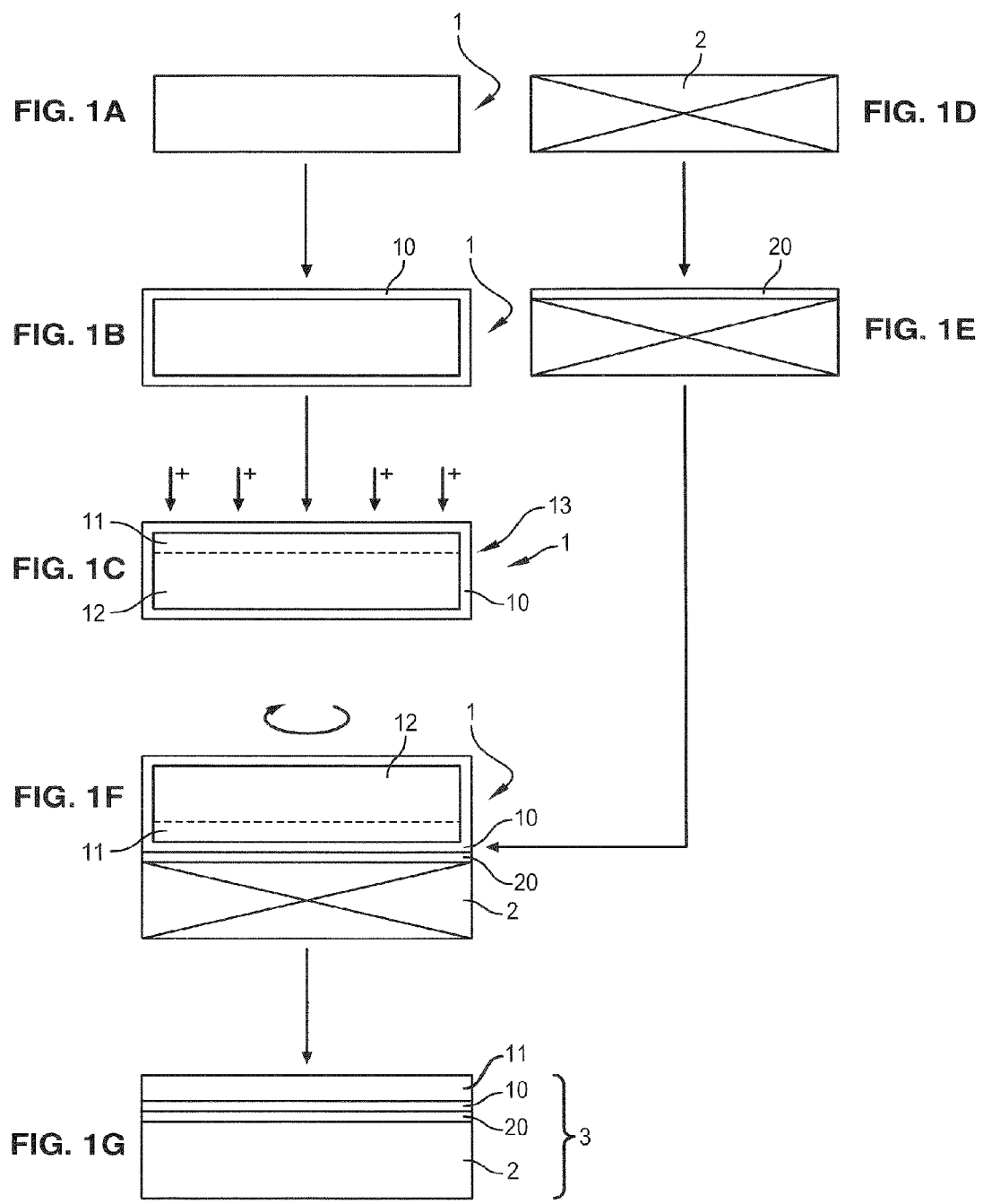
FIGS. 1A to 1E represent the different steps of a process according to the invention.
Figure 2:
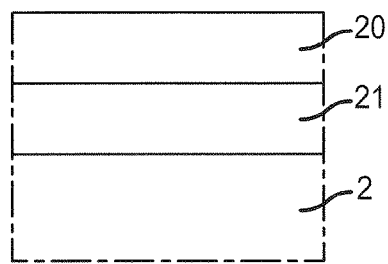
FIG. 2 is a detailed view of part of the structure into which a decoupling layer is interleaved.

The present method is preferably applied to an SOI structure that successively comprises a support substrate made of silicon, an oxide layer and a thin layer of semiconductor material, a polycrystalline silicon layer being interleaved between the support substrate and the oxide layer. The process comprises the following steps:

a) oxidation of a donor substrate made of semiconductor material to form an oxide layer at the surface;

b) implantation of ions in the donor substrate to form an embrittlement zone therein;

c) adhesion of the donor substrate to the support substrate, the oxide layer being located at the adhesion interface, the support substrate having undergone thermal treatment capable of giving it high resistivity, that is, a resistivity greater than 500 Ω·cm, its upper face which receives the donor substrate being coated by the polycrystalline silicon layer;

d) fracture of the donor substrate according to the embrittlement zone to transfer to the support substrate a thin layer of semiconductor material;

e) conducting of at least one stabilization process of the resulting structure.

This process is remarkable in that the treatment capable of conferring high resistivity to the support substrate is carried out prior to formation of the polycrystalline silicon layer, and in that step e) comprises at least one long thermal step, carried out at a temperature not exceeding 950° C., for at least 10 minutes.

The polycrystalline silicon is thus deposited after treatment capable of giving the support substrate high resistivity, such that high temperatures utilized during this treatment do not affect the polycrystalline character of the polycrystalline silicon layer.

Similarly, thermal budget used during thermal treatment of the final structure is not sufficient to modify this polycrystalline character.

According to other advantageous and non-limiting characteristics:
the resistivity of the support substrate is greater than 1,000 Ω·cm, preferably greater than 2,000 Ω·cm, still more preferably greater than 3,000 Ω·cm;
the long thermal step is carried out for several hours;
it comprises brief treatment conducted for less than 10 minutes, at a temperature greater than 1,000° C., advantageously for one to two minutes, at a temperature of the order of 1,200° C.;
thermal treatment capable of conferring high resistivity to the support substrate comprises at least one step brought to a temperature of between 500° C. and 1,200° C., for 30 minutes to 20 hours;
thermal treatment capable of conferring high resistivity to the support substrate is an annealing treatment in three steps, the second step being brought to a temperature less than that of the other two steps;
the three steps are carried out respectively at a temperature of between 1,000° C. and 1,200° C. for 1 to 10 hours, 600° C. to 900° C. for 1 to 10 hours, and 900° C. to 1,200° C. for 1 to 48 hours;
in step e), the stabilization comprises at least one thermal stabilization treatment and one thermal thinning treatment of the thin layer;
in step c), prior to depositing of the polycrystalline silicon layer, a semiconductive decoupling layer of crystalline network, that is, having a mesh parameter different to that of monocrystalline silicon is deposited onto the receiver substrate;
the decoupling layer contains polycrystalline silicon;
the decoupling layer also contains silicon-based and another atomic species-based semiconductor material;
the silicon-based conductive material is SiC or SiGe;
depositing of the decoupling layer and of the polycrystalline silicon layer is carried out continuously, that is, in the first instance, by simultaneous feed from two gas sources, respectively polycrystalline silicon and the other atomic species, then by feed only from the polycrystalline silicon source;
a new decoupling layer is also deposited onto the polycrystalline silicon layer;
at least one stack constituted by a polycrystalline silicon layer and a decoupling layer are then deposited onto the new decoupling layer;

The invention also relates to a structure of semiconductor on insulator type, with reduced electrical losses, which successively comprises a support substrate made of silicon, an oxide layer and a thin layer of semiconductor material, a polycrystalline silicon layer being interleaved between the support substrate and the oxide layer and is remarkable in that the polycrystalline silicon layer has a resistivity greater than 5,000 Ohms·cm.

Preferably, it has an average resistivity greater than 10,000 Ohms·cm, or even greater than 50,000 Ohms·cm.

As pointed out earlier, the process according to the invention is of the SMART CUT® type.

FIG. 1A accordingly illustrates a donor substrate 1 in silicon (Si), preferably monocrystalline, covered by a layer 10 of silicon dioxide (SiO$_2$). This corresponds to FIG. 1B.

This oxide layer can result from thermal oxidation of the donor substrate 1 or has been formed by conventionally depositing by chemical depositing techniques in a vapor phase well known to the person skilled in the art under the acronyms CVD and LPCVD (for "Chemical Vapor Deposition" and "Low Pressure Chemical Vapor Deposition").

With reference to FIG. 1C, the donor substrate 1 is subjected to implantation of atomic or ionic species via an oxide layer.

"Implantation of atomic or ionic species" is understood as any bombardment of these species capable of introducing them to the donor substrate 1 with maximal concentration to a predetermined depth of the substrate 1 relative to the bombarded surface, with a view to creating an embrittlement zone 13. This type of implantation is done according to the process known by the name SMART CUT®).

The embrittlement zone 13 delimits a thin layer 11 from the rest 12 of the donor substrate 1.

The implantation of atomic or ionic species can be a simple implantation, that is, implantation of a single atomic species such as, for example, implantation of hydrogen, helium or a noble gas.

Implantation can also be co-implantation of atomic or ionic species, such as helium and hydrogen.

A receiver substrate 2 is illustrated in FIG. 1D, and is a solid substrate made of silicon.

A characteristic of this support substrate 2 is having undergone thermal treatment capable of giving it an other resistivity, that is, a resistivity greater than 500 Ω·cm, or even greater than 1,000, preferably still greater than 2,000, or even still more preferably greater than 3,000 Ω·cm.

This treatment may have been carried out since fabrication of the substrate 2 or later on, within the scope of the present process.

This thermal treatment capable of giving the support substrate 2 high resistivity is a thermal treatment, for example, comprising at least one step brought to a temperature of between 500° C. and 1,200° C. for 30 minutes to 20 hours.

In another embodiment, this treatment comprises an annealing treatment in three steps, the second step being brought to a temperature less than that of the other two steps.

Advantageously, these three steps are carried out respectively at a temperature of between 1,000° C. and 1,200° C. for 1 to 10 hours, 600° C. to 900° C. for 1 to 10 hours and 900° C. to 1,200° C. for 1 to 48 hours.

The function of the first step of this advantageous and optional treatment, also known as "high-low-high treatment," is to remove oxygen from a superficial zone of the substrate, by a phenomenon known as "exodiffusion" to produce a denuded zone, that is, a zone without oxygen precipitates. This is therefore a zone having fewer defects than at the outset, an advantage for subsequent depositing of polysilicon.

The aim of the second step of this process is to enable nucleation, that is, the creation of "embryos" of interstitial oxygen precipitates.

Finally, the function of the third step of this process is to enable growth of precipitates created in the preceding step, that is, to constitute oxide clusters. This translates via an increase in resistivity of the material.

In any case, this augmentation treatment of the resistivity of the substrate 2 is carried out prior to depositing, on the substrate 2, of a polycrystalline silicon layer 20.

Proceeding with this effectively retains the polycrystalline structure of the layer 20.

After the donor substrate 1 is reversed, it is then put in contact with the layer 20 of the support substrate 2, such that the oxide layer 10 regains contact with the polysilicon layer 20.

Adhesion between the two substrates 1, 2 is completed in a preferred, but non-obligatory manner, by molecular adhesion.

Disbonding annealing is carried out, followed by detachment from the rest 12 of the donor substrate 1, at the level of the embrittlement zone 13, so as to transfer the layer 11 to the support substrate 2, more precisely on the polysilicon layer 20.

This produces a substrate 3 of semiconductor on insulator type which is in semi-finished state.

Stabilization of the resulting structure 3 is then carried out.

In keeping with the invention, this stabilization comprises a long thermal step, carried out at a temperature not exceeding 950° C. for at least 10 minutes, and optionally a brief treatment carried out for less than 10 minutes at a temperature greater than 1,000° C.

The long thermal step is preferably carried out for several hours, whereas the brief treatment is carried out for one to two minutes at a temperature of the order of 1,200° C.

More precisely, these finishing steps comprise at least one of the following treatments:

a) thermal stabilization treatment before polishing, consuming the zone of the donor substrate damaged by separation at the level of the interface 13;

b) mechanical and chemical polishing treatment (CMP) for consuming the material of the layer 11 to arrive at the preferred thickness;

c) final thermal thinning treatment to attain the final preferred thickness.

In respecting the temperature and duration conditions indicated earlier, thermal budgets carried out are inadequate for recrystallized polysilicon, which loses its beneficial effects.

But, limiting the duration and/or temperature of the treatments during stabilization of the structure 3 causes embrittlement of the interface created such that it is highly useful to carry out intermediate treatments for reinforcing cohesion of the structure 3. A particular treatment is carried out prior to adhesion using plasma.

In accordance with a preferred embodiment of the process according to the invention, the polycrystalline silicon layer 20 is formed on a layer 21 known as "network crystalline decoupling," that is, a layer having a concentration gradient with a mesh parameter different to that of silicon formed by the support substrate 2.

This difference in mesh parameter is, for example, greater than 5%.

This decoupling layer advantageously contains polycrystalline silicon, but, in no case pure monocrystalline silicon.

According to a preferred embodiment, it also contains a silicon-based and another atomic species-based semiconductor material.

This can be SiC or SiGe, for example.

The advantage of this gradient layer between the support substrate 2 and the polysilicon layer is that it prevents the polysilicon from recrystallizing from the layer 11.

This gradient layer opposes recrystallization of polysilicon. Via its cavities and grain joints, the polysilicon layer:

traps the contaminants generating a drop in resistivity (B, P, Ca, Na, etc.);

forms a barrier to electrical charges contained under the oxide layer 10;

prevents diffusion of interstitial oxygen contained in the oxide layer 10 (diffusion causing poor trapping, such as a "gettering" effect).

The decoupling layer 21 as well as the polysilicon layer 20 are preferably manufactured in the same depositing step, continuously, meaning that the decoupling layer 21 is first formed by injecting a first gas to constitute polysilicon and a second gas to constitute the other atomic species; then, once the preferred thickness is attained, the arrival of the second gas is cut off by continued injecting of the gas to form the polysilicon layer 20.

Figure 3:
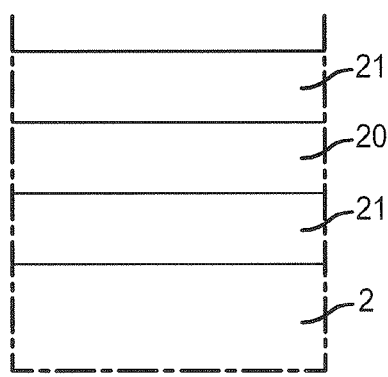
FIG. 3 is a variant of FIG. 2 in which an additional decoupling layer is formed on the polycrystalline silicon.

As shown in FIG. 3, a new decoupling polysilicon layer can also be constituted, which prevents the decoupling polysilicon layer from recrystallizing from the thin layer of semiconductor material 11 (FIG. 1C).

Optionally, a stack comprising decoupling layer 21/polysilicon layer 20/decoupling layer 21/polysilicon layer 20, etc., can be formed.

Advantageously, the total thickness of the polysilicon layer 20 and of the decoupling layer 21 or decoupling layers is between 3,000 and 10,000 Å, with a ratio 10 between the thickness of the polysilicon layer 20 and the decoupling layer 21.

Figure 4:
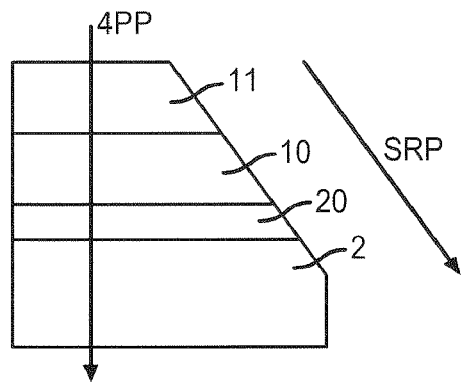
FIG. 4 is a sectional view of a structure according to the invention whereof the resistivity is proposed to be tested.

FIG. 4 proposes testing the resistivity of a structure obtained according to the invention.

This characterization is done by means of the well-known method called "4PP" (for "four points probe"), specifically by using 4 electrodes passing through the entire structure.

A second method known as "SRP," also well known, traces the evolution of resistivity as a function of the depth, by means of a mitre, as shown by the abovementioned FIG. 3.

Irrespective of the method used, it is evident that the structure treated according to the process and, according to the invention, retains high resistivity, compared to the same structure, which would not have undergone the process according to the invention.

Using the method known as "4PP" and by conducting comparative tests, average resistivity rises from 4 to 5,000 Ω·cm to over 70,000 Ω·cm.

Figure 5A:
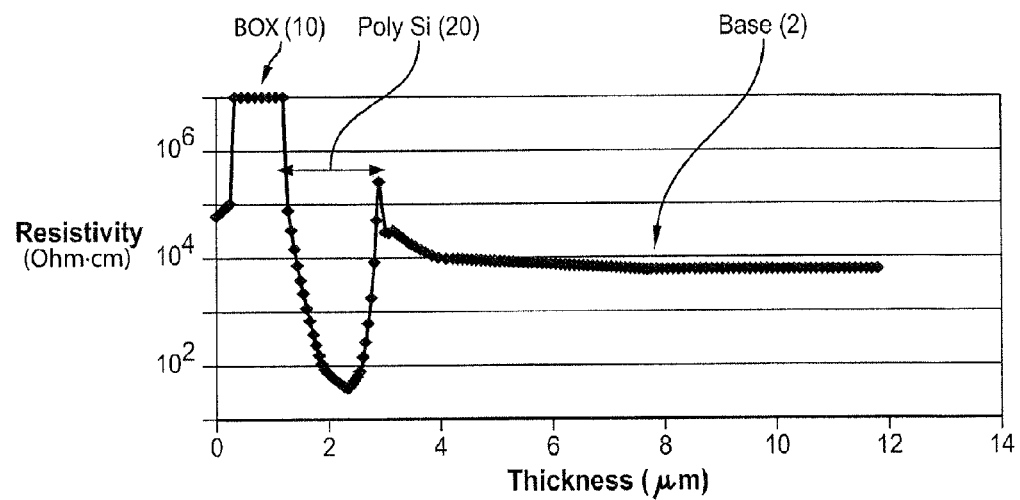
FIGS. 5A and 5B are graphics, respectively, illustrating according to the prior art and according to the invention resistivity measured via a structure such as that of FIG. 4, utilizing the "SRP" method.
Figure 5B:
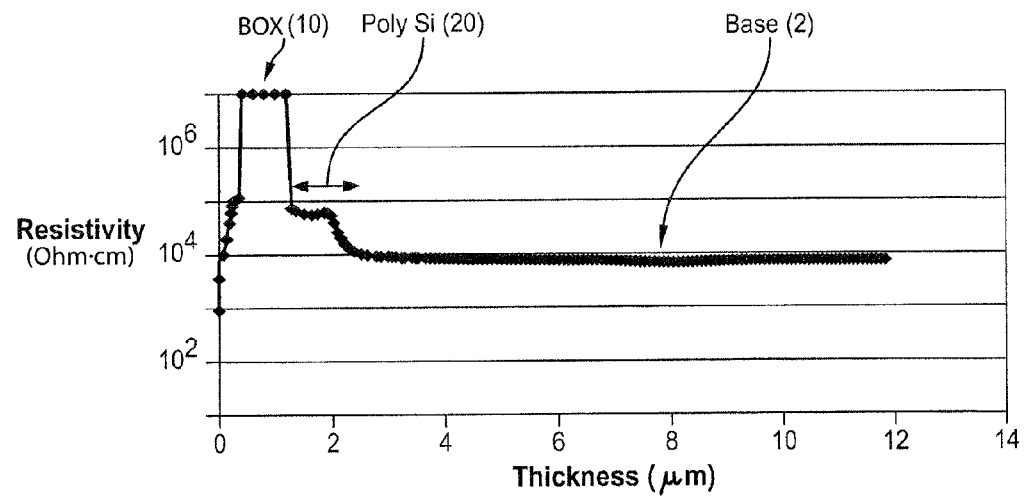

Furthermore, and as shown in FIGS. 5A and 5B, the method known as "SRP" tested on a structure according to the prior art cited at the outset of the description (FIG. 5A), comparatively to the invention (FIG. 5B), shows that, according to the invention, the polysilicon layer has very high resistivity, contrary to the structure according to the prior art.

This is due to the fact that the polysilicon has retained its polycrystalline structure.

Finally, tests were conducted by "injecting" an electrical signal in a component.

The power of harmonics as a function of the principal signal is then measured.

When components used in the field of radio-frequencies are operating, parasite signals can be generated by the electrical signals that pass through them at different frequencies. These are known as harmonic waves.

In the case of a glass substrate, almost no harmonic is generated, and the more the substrate on which the electronic component is made high-performing, the less is the power of the harmonics.

In the case of a support substrate 2 made of high-resistivity silicon, without the presence of a polycrystalline silicon layer under the "BOX" Buried OXide Layer, the harmonics are high.

With the presence of such a layer, though without modifying thermal treatments, electrical performance is improved, but thermal budget causes partial recrystallization or even total recrystallization of the poly-Si and eliminates significant electrical traps.

Finally, the presence of polycrystalline silicon under the BOX considerably improves electrical performance, since the manufacturing process is applied according to the invention and/or a decoupling layer is introduced, which prevents recrystallization of the silicon.

It is evident, finally, that depositing a gradient layer between the support substrate and the polycrystalline silicon can also be carried out within the scope of manufacturing a structure of SOI type, other than by the SMART CUT® technique.

What is claimed is:

1. A semiconductor-on-insulator (SeOI) structure comprising a support substrate made of silicon, an oxide layer, and a thin layer of semiconductor material, wherein:
   a polycrystalline silicon layer is interleaved between the support substrate and the oxide layer, the polycrystalline silicon layer having a resistivity that is greater than 5,000 Ω·cm; and
   a semiconductive decoupling layer is disposed on the support substrate and between the support substrate and the polycrystalline silicon layer, the semiconductor decoupling layer having a mesh parameter different form a mesh parameter of the support substrate.

2. The SeOI structure of claim 1, wherein the polycrystalline silicon layer has an average resistivity that is greater than 10,000 Ohms·cm.

3. The SeOI structure of claim 2, wherein the polycrystalline silicon layer has an average resistivity that is greater than 50,000 Ohms·cm.

4. The SeOI structure of claim 1, wherein the resistivity of the support substrate is greater than 1,000 Ω·cm.

5. The SeOI structure of claim 1, wherein the resistivity of the support substrate is greater than 2,000 Ω·cm.

6. The SeOI structure of claim 1, wherein the resistivity of the support substrate is greater than 3,000 Ω·cm.

7. The SeOI structure of claim 1, wherein the support substrate comprises monocrystalline silicon.

8. The SeOI structure of claim 1, wherein the decoupling layer comprises polycrystalline silicon.

9. The SeOI structure of claim 8, wherein the semiconductive decoupling layer also contains another atomic species-based semiconductor material.

10. The SeOI structure of claim 1, wherein the semiconductive decoupling layer is SiC or SiGe.

11. The SeOI structure of claim 1, further comprising another decoupling layer between the polycrystalline silicon layer and the thin layer of semiconductor material.

12. The SeOI structure of claim 11, further comprising at least one layer stack constituting at least one additional polycrystalline silicon layer and at least one additional decoupling layer between the another decoupling layer and the thin layer of semiconductor material.

13. The SeOI structure of claim 1, wherein the support substrate has a resistivity that is greater than 1,000 Ω·cm and the polycrystalline silicon layer has a resistivity that is greater than 10,000 Ohm s·cm.

14. The SeOI structure of claim 1, wherein the semiconductive decoupling layer contains polycrystalline silicon and another atomic species-based semiconductor material.

15. The SeOI structure of claim 1, wherein the oxide layer comprises silicon dioxide.

16. The SeOI structure of claim 1, wherein the mesh parameter of the semiconductive decoupling layer differs from the mesh parameter of the support substrate by greater than 5%.

17. A semiconductor-on-insulator (SeOI) structure comprising a monocrystalline silicon support substrate, an oxide layer, and a thin layer of semiconductor material, wherein:
   a decoupling layer is disposed on a surface of the support substrate, the decoupling layer comprising a polycrystalline material including silicon and having a mesh parameter different from a mesh parameter of the support substrate;
   a polycrystalline silicon layer is disposed on the decoupling layer on a side thereof opposite the support substrate, the polycrystalline silicon layer having a resistivity that is greater than 5,000 Ohms·cm;
   the oxide layer is disposed over the polycrystalline silicon layer on a side thereof opposite the support substrate; and
   the thin layer of semiconductor material is disposed over the oxide layer on a side thereof opposite the support substrate.

18. The SeOI structure of claim 17, wherein the decoupling layer includes another atomic species-based species in addition to silicon.

19. The SeOI structure of claim 18, wherein the decoupling layer comprises SiC or SiGe.

* * * * *